United States Patent
Moebis et al.

(10) Patent No.: US 11,133,144 B2
(45) Date of Patent: Sep. 28, 2021

(54) FUSE, FUSE BODY, SYSTEM AND METHOD

(71) Applicant: Siemens Aktiengesellschaft, Munich (DE)

(72) Inventors: Florian Moebis, Nuremberg (DE); Adolf Schmid, Laaber (DE); Roland Schmidt, Schwarzenbruck (DE); Volker Seefeld, Burglengenfeld (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/535,244

(22) Filed: Aug. 8, 2019

(65) Prior Publication Data
US 2020/0051768 A1    Feb. 13, 2020

(30) Foreign Application Priority Data
Aug. 10, 2018    (DE) .................... 10 2018 213 522.3

(51) Int. Cl.
*H01H 85/02*    (2006.01)
*H01H 85/30*    (2006.01)
(Continued)

(52) U.S. Cl.
CPC .......... *H01H 85/0241* (2013.01); *G01K 1/14* (2013.01); *G01R 15/202* (2013.01);
(Continued)

(58) Field of Classification Search
CPC ............... H01H 85/0241; H01H 85/30; H01H 2085/0266; G01K 1/14; G01R 15/202; G01R 15/207
(Continued)

(56) References Cited

U.S. PATENT DOCUMENTS 1,353,123 A * 9/1920 Kries ................ H01H 85/0456
                                                  337/229
1,635,049 A * 7/1927 McGee ................ H01H 85/42
                                                  337/219
(Continued)

FOREIGN PATENT DOCUMENTS

CA      2340772 A1    4/2000
CN      1377508 A    10/2002
(Continued)

*Primary Examiner* — Anatoly Vortman
(74) *Attorney, Agent, or Firm* — Harness, Dickey & Pierce, P.L.C.

(57) ABSTRACT

A fuse includes a protective housing and a measurement device. Two electrical connection elements of the fuse are routed out of the protective housing and at least one fuse element is arranged in the protective housing, the at least one fuse element electrically conductively connecting the two electrical connection elements in the protective housing to one another. The measurement device includes a sensor element to record a physical state measured value of the fuse and a transmission apparatus to transmit the measured value to a reception device arranged outside the fuse. The measurement device further includes a dedicated housing in which the sensor element is received and held, the dedicated housing being mechanically connected to the protective housing. An overall installation space required for the protective housing and the dedicated housing corresponds to an installation space of a standardized NH fuse. The fuse is usable for retrofit applications.

23 Claims, 2 Drawing Sheets

(51) Int. Cl.
  *G01R 15/20* (2006.01)
  *G01K 1/14* (2021.01)
(52) U.S. Cl.
  CPC ........... *G01R 15/207* (2013.01); *H01H 85/30* (2013.01); *H01H 2085/0266* (2013.01)
(58) Field of Classification Search
  USPC ........................................................ 337/290
  See application file for complete search history.

(56) References Cited

U.S. PATENT DOCUMENTS

| | | | | |
|---|---|---|---|---|
| 2,111,749 A * | 3/1938 | Bussmann | ............. | H01H 71/20 337/164 |
| 2,300,620 A * | 11/1942 | Duerkob | ............. | H01H 85/044 337/164 |
| 3,735,312 A * | 5/1973 | Nagel | ............. | H01C 3/20 337/164 |
| 3,958,206 A * | 5/1976 | Klint | ............. | H01H 39/00 337/406 |
| 4,538,133 A * | 8/1985 | Pflanz | ............. | H01H 39/006 218/95 |
| 4,604,613 A * | 8/1986 | Clark | ............. | G01R 19/15 250/227.15 |
| 4,641,120 A * | 2/1987 | Bonfig | ............. | H01H 85/32 337/242 |
| 4,661,807 A * | 4/1987 | Panaro | ............. | G01R 31/50 340/638 |
| 5,406,438 A * | 4/1995 | Ranjan | ............. | H01H 85/042 361/103 |
| 6,211,768 B1 * | 4/2001 | Cress | ............. | H01H 85/042 337/161 |
| 6,445,276 B2 * | 9/2002 | Schon | ............. | H01H 85/46 337/184 |
| 7,636,028 B2 * | 12/2009 | Rodseth | ............. | H01H 85/30 324/550 |
| 7,969,275 B2 * | 6/2011 | Hartzog | ............. | H01H 85/0241 337/159 |
| 8,686,596 B2 * | 4/2014 | Huss | ............. | H01H 85/32 307/117 |
| 2005/0088271 A1 * | 4/2005 | Lau | ............. | G01R 31/74 337/206 |
| 2006/0077607 A1 * | 4/2006 | Henricks | ............. | H02J 13/00001 361/93.1 |
| 2008/0042796 A1 * | 2/2008 | Moffat | ............. | H01H 85/24 337/237 |
| 2008/0165461 A1 * | 7/2008 | Paik | ............. | H02H 3/0935 361/87 |
| 2009/0184797 A1 * | 7/2009 | Hartzog | ............. | H01H 85/0241 337/187 |
| 2011/0169599 A1 * | 7/2011 | Darr | ............. | H01H 9/104 337/143 |
| 2012/0127621 A1 * | 5/2012 | Knapp, Jr. | ............. | H02H 3/093 361/94 |
| 2014/0104032 A1 * | 4/2014 | Buzzard | ............. | H01H 9/102 337/5 |
| 2015/0229118 A1 * | 8/2015 | Hasunuma | ............. | H01C 7/02 361/93.8 |
| 2016/0013631 A1 * | 1/2016 | Ehrler | ............. | H02H 3/20 361/91.1 |
| 2016/0109212 A1 * | 4/2016 | Bader | ............. | H02H 3/087 102/275.9 |
| 2018/0025877 A1 * | 1/2018 | Froehner | ............. | H02J 13/0006 324/424 |
| 2018/0331571 A1 * | 11/2018 | Smit | ............. | G01R 15/202 |
| 2019/0371561 A1 * | 12/2019 | Ehrhardt | ............. | H01H 85/12 |

FOREIGN PATENT DOCUMENTS

| | | | | |
|---|---|---|---|---|
| DE | 19744765 A1 | 4/1999 | | |
| DE | 102014205871 A1 | 10/2015 | | |
| DE | 102016211621 A1 | 12/2017 | | |
| DE | 102017221937 A1 * | 6/2019 | ........... | H01H 85/306 |
| EP | 0917723 B1 | 3/2000 | | |
| EP | 1116252 B1 | 7/2002 | | |
| WO | WO 2008092469 A1 | 8/2008 | | |
| WO | WO 2017078525 A1 | 5/2017 | | |

* cited by examiner

FIG 1

Related Art

FUSE, FUSE BODY, SYSTEM AND METHOD

PRIORITY STATEMENT

The present application hereby claims priority under 35 U.S.C. § 119 to German patent application number DE 102018213522.3 filed Aug. 10, 2018, the entire contents of which are hereby incorporated herein by reference.

FIELD

At least one embodiment of the invention generally relates to a fuse having a protective housing out of which two electrical connection elements are routed and in which at least one fuse element is arranged, which fuse element electrically conductively connects the two connection elements to one another, and having a measurement device that has a sensor element for recording a physical state measured value of the fuse and a transmission apparatus for transmitting the measured value to a reception device arranged outside the fuse. At least one embodiment of the invention furthermore relates to a fuse body for such a fuse, to a system for monitoring the state of an electrical circuit that has at least one fuse, and/or to a method for monitoring an electrical circuit having at least one such state monitoring system.

BACKGROUND

Conductors that are flowed through by an electric current heat up. In the case of impermissibly high currents, this may result in an impermissibly great heating of the conductor and, as a result, in melting of the insulation surrounding the conductor, which may lead to results as severe as a cable fire. To prevent this fire risk, in the event of an occurrence of an excessively high electric current, that is to say of an overload current or of a short-circuit current, this electric current has to be promptly disconnected. This is ensured using what is known as an overcurrent protection apparatus.

One example of such an overcurrent protection apparatus is for example a fuse that interrupts the circuit through the melting of one or more fuse elements when the current strength of the circuit protected by the fuse exceeds a particular value for more than a particular time. The fuse includes an insulating body, which has two electrical terminals that are electrically conductively connected to one another by one or more fuse elements inside the insulating body. The fuse element, which has a reduced cross section in comparison with the rest of the conductors in the circuit, is heated by the current flowing through it and melts when the critical nominal current of the fuse is significantly exceeded for a predetermined time. Ceramic is mostly used as material for the insulating body due to its good insulation properties. The use of a fuse in this manner is already known in principle for example from European patent document EP 0 917 723 B1 or from German laid-open documents DE 10 2014 205 871 A1 and DE 10 2016 211 621 A1.

Fuses are able to be obtained in various structural types. In addition to simple device fuses, which have a simple glass cylinder in which the fuse element is received, there are also structures in which the ceramic body is filled with sand—mainly quartz sand: in this case, a distinction is drawn between types having solidified and having unsolidified quartz sand. In the case of a fuse with solidified sand, the fuse element is surrounded by quartz sand. The housing of the fuse is generally in this case formed by a ceramic body in which the solidified sand, the electrical terminals and the fuse element are received or held. The quartz sand in this case functions as a light arc-extinguishing means: if the nominal current of the fuse is significantly exceeded—for example due to a high short-circuit current—then this leads to the fuse being stressed, during which stress the fuse element first of all melts and then evaporates due to the high temperature development. This gives rise to an electrically conductive plasma by way of which the current flow between the electrical terminals is first of all maintained—an arc forms. Since the metal vapor of the evaporated fuse precipitates on the surface of the grains of quartz sand, the arc is in turn cooled. As a result, the resistance inside the fuse insert increases such that the arc is ultimately extinguished. The electrical line to be protected by the fuse is thus interrupted.

Low-voltage high-power fuses, what are known as NH fuses, but also semiconductor fuses, what are known as HLS fuses, as are marketed for example under the product name SITOR, are already known in principle from the prior art in the field of fuses. In the case of NH fuses, one or more fuse elements in the form of metal strips are normally used. In this case, the fuse elements mostly have what are known as rows of narrow points in order to selectively disconnect the fuse. Furthermore, at least one solder deposit may be applied to one or more of the fuse elements, by way of which solder deposit the overload characteristic of the fuse is able to be influenced. The relevant permitted power value $I^2t$ for the disconnection behavior of the fuse is relatively high in the case of NH fuses, as a result of which these have a somewhat more lethargic characteristic.

If the fuse element is heated by an electric overload current to a temperature that lies above the melting temperature of the solder, then this solder diffuses into the fuse element material and forms an alloy therewith. The electrical resistance of the fuse element thereby increases, which leads to further heating thereof, as a result of which the diffusion procedure is accelerated further until the fuse element has completely dissolved into the surroundings of the solder deposit, such that it breaks off, as a result of which the current flow is interrupted. In the case of a brief, permissible overcurrent, no early disconnection takes place by virtue of the NH fuse. If a short-circuit current occurs, by contrast, the fuse element tears off at the rows of narrow points. As a result, a plurality of small series-connected light arcs arise at the same time whose voltages add up and thus lead to quicker disconnection of the fuse. NH fuses serve for example to protect installations or switching cabinets from fire, for example caused by overheated connecting lines.

On the part of the operators of electrical installations, there is a desire to be able to query the state of an electrical installation. In the past, this was often carried out by way of a visual check—in the case of fuses for example in that the fuses are equipped with an indicator that optically signals tripping of the respective fuse externally on the housing of the fuse in question. For the future, however, it is increasingly required to be able to query this information at any time and as far as possible in a manner independent of location, for example from a control station. For this reason, electrical installation devices are additionally being supplemented so as to provide information about their operating state. Electrical switching devices, such as for example fire protection switches, which already have dedicated control logic, are able to be supplemented with relatively little expenditure so as to prepare and provide corresponding information.

In the case of fuses, there are corresponding solutions involving recording and forwarding the "triggered" information, provided optically by the indicator, by way of a communication module able to be attached to the fuse. Attachable solutions however have the disadvantage that they require additional installation space and are therefore able to be used only with relatively high expenditure in pre-existing installations. For a simple retrofit use, in which an existing fuse without a communication module is replaced with a new fuse having a corresponding communication module within the meaning of retrofitting or modernization of the installation, these attachable solutions are often not used as the additional installation space required therefor is not available.

To solve this problem of limited installation space, which occurs especially in the case of retrofit applications, international patent application WO 2017/078525 A1 describes a fuse in which a current sensor is integrated into the pressure body of the fuse. By way of this current sensor, the current flow through the fuse occurring during normal operation is able to be measured and transmitted to a querying unit arranged outside the fuse.

SUMMARY

The inventors have discovered that since comparatively high temperatures may also however occur in a fuse, it is questionable as to how reliably a sensor integrated into the pressure body of the fuse functions over the service life of the fuse.

Embodiments of the invention are therefore directed to providing a fuse, a fuse body, a system for monitoring the state of an electrical circuit having at least one such fuse and a method for monitoring an electrical circuit that has at least one state monitoring system having at least one fuse, all of which at least partly overcome the abovementioned problems.

Embodiments of the invention are directed to a fuse, a state monitoring system and a method for monitoring an electrical circuit. Advantageous configurations of the fuse, etc. are the subject matter of the claims.

The fuse according to at least one embodiment of the invention has a protective housing out of which two electrical connection elements of the fuse are routed and in which at least one fuse element is arranged, which fuse element electrically conductively connects the two connection elements in the protective housing to one another. The fuse furthermore has a measurement device that has a sensor element for recording a physical state measured value of the fuse and a transmission apparatus for transmitting the measured value to a reception device arranged outside the fuse. The measurement device in this case has a dedicated housing in which the sensor element is received and held and that is mechanically connected to the protective housing, wherein the overall installation space required for the protective housing and the further housing corresponds to the installation space of a standardized NH fuse.

The fuse body according to at least one embodiment of the invention for a fuse of the type described in at least one embodiment above has a first reception space designed to receive the fuse element and a second reception space, designed to receive the measurement device and spatially separated from the first reception space, wherein the second reception space forms a structural unit with the first reception space.

The system according to at least one embodiment of the invention for monitoring the state of an electrical circuit has at least one fuse of an embodiment of the type described above. The system furthermore has a reception device that is arranged outside the fuse and is designed to receive a measured value transmitted by the transmission apparatus.

The method according to at least one embodiment of the invention for monitoring an electrical circuit, which has at least one state monitoring system of the type described above having at least one fuse, includes the steps:
 a) measuring a physical measured value of the fuse using the measurement device;
 b) transmitting the physical measured value to a reception device, arranged outside the fuse, of the system, using the transmission apparatus; and
 c) further processing the transmitted measured value.

At least one embodiment is directed to a fuse including an integrated measurement function, comprising:
 a protective housing, two electrical connection elements of the fuse being routed out of the protective housing and at least one fuse element being arranged in the protective housing, the at least one fuse element electrically conductively connecting the two electrical connection elements in the protective housing to one another; and
 a measurement device including a sensor element to record a physical state measured value of the fuse and a transmission apparatus to transmit the measured value to a reception device arranged outside the fuse, the measurement device further including a dedicated housing in which the sensor element is received and held, the dedicated housing being mechanically connected to the protective housing, an overall installation space required for the protective housing and the dedicated housing corresponding to an installation space of a standardized NH fuse.

BRIEF DESCRIPTION OF THE DRAWINGS

One example embodiment of the fuse and of the fuse body is explained in more detail below with reference to the appended figures. In the figures.

In the various figures of the drawing, identical parts are always provided with the same reference signs. The description applies to all of the drawing figures in which the corresponding part is likewise able to be seen.

DETAILED DESCRIPTION OF EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

The fuse according to at least one embodiment of the invention has a protective housing out of which two electrical connection elements of the fuse are routed and in which at least one fuse element is arranged, which fuse element electrically conductively connects the two connection elements in the protective housing to one another. The fuse furthermore has a measurement device that has a sensor element for recording a physical state measured value of the fuse and a transmission apparatus for transmitting the measured value to a reception device arranged outside the fuse. The measurement device in this case has a dedicated housing in which the sensor element is received and held and that is mechanically connected to the protective housing, wherein the overall installation space required for the protective housing and the further housing corresponds to the installation space of a standardized NH fuse.

The protective housing, which may also be referred to as pressure housing or pressure body, serves to receive the pressure occurring when the fuse is heated or tripped. High requirements are therefore placed on the mechanical strength and stability of the protective housing. In contrast thereto, the housing of the measurement device serves to receive and to fasten the sensor element and to protect it against external disruptions such as moisture and/or dirt. Considerably lower requirements are therefore placed on the mechanical stability of this housing.

The two housings are mechanically connected to one another. This connection may be designed to be fixed but detachable, for example in the form of a screw connection. It is however likewise possible to design the protective housing and the housing of the measurement device to be integral, wherein the subregion corresponding to the protective housing has the required mechanical stability of a pressure housing. It is however essential to the invention that the combined installation space taken up by the protective housing and housing of the measurement device corresponds to the predefined installation space of a standardized NH fuse, wherein the measurement device is now simply additionally arranged in an integrated manner in this installation space. In this way, the fuse is also able to be used for retrofit applications in the context of retrofitting or modernization of existing installations in which a conventional fuse without a measurement device is replaced.

The measurement device is in this case designed to record a physical state measured value of the fuse, that is to say a physical measured value, that characterizes the operating state of the fuse, and to transmit it to the reception device arranged outside the fuse using the transmission apparatus. For this purpose, for example, electrical measured variables such as electric current and/or electric voltage, but also other physical measured variables, such as for example the temperature of the fuse, come into consideration. In this way, it is possible not only to arrive at a digital conclusion as to whether or not the fuse has tripped, but rather, by way of recording the current temperature of the fuse, it is also possible to arrive at a conclusion as to whether or not the fuse will shortly trip, or the current state of the fuse and, accordingly, the length of its remaining service life.

In one advantageous development of the fuse, the measurement device has a further sensor element for recording a further physical state measured value of the fuse.

Using the further sensor element, a further physical state measured value of the fuse—for example current and voltage—is able to be recorded and transmitted to the reception device arranged outside the fuse. In this way, the current operating state of the fuse is able to be determined more accurately. The further sensor element may in this case likewise be received and held in the housing of the measurement apparatus.

In a further advantageous embodiment and development of the fuse, the transmission apparatus is also arranged in the housing of the sensor element. The transmission apparatus may in this case be arranged either in the cavity enclosed by the housing of the sensor element. It would however also be possible to integrate the transmission apparatus completely or partly into the housing wall. In this way, a compact fuse is able to be produced.

In a further advantageous embodiment and development of the fuse, the measurement device furthermore has a processing apparatus for processing the measured value, which processing apparatus is likewise arranged in the housing of the sensor element and coupled to the sensor element and to the transmission apparatus. The processing apparatus is in this case electrically coupled both to the sensor element and to the transmission apparatus. This coupling is in this case able to be produced in an electrically conductive manner, that is to say in a wired manner, but also wirelessly, for example via radio.

In a further advantageous embodiment and development of the fuse, the processing apparatus has a microprocessor or a microcontroller. Advantageously, the processing apparatus has a microprocessor or a microcontroller that allows the recorded measured data to be processed, for example aggregated, and routes a corresponding signal to the transmission apparatus in order to transmit said signal to the reception device arranged outside the fuse only if a predefined condition is present. The data volume is thereby considerably reduced.

In a further advantageous embodiment and development of the fuse, the sensor element is designed to record a current measured value of the fuse and, to this end, has a transformer or a Hall-effect sensor.

A Rogowski coil comes into consideration for example as transformer. In this case, this is a toroidal air-core coil that does not have a ferromagnetic core and is used, inter alia, to measure AC current. The Rogowski coil is also known as a "Rogowski transformer". In the case of a Hall-effect sensor, which is also known as a Hall sensor or Hall probe, what is known as the Hall effect is utilized to measure magnetic fields: if a simple Hall sensor is flowed through by a current and placed in a magnetic field running perpendicular thereto, it delivers an output voltage that is proportional to the product of the magnetic flux density and the current. Both a transformer and a Hall-effect sensor constitute suitable sensor elements for the present case of application due to their small structural size.

In a further advantageous embodiment and development of the fuse, the sensor element is designed to record a temperature measured value of the fuse.

Recording the temperature present inside the fuse makes it possible not only to arrive at a conclusion as to whether the fuse has already tripped, but furthermore makes it possible to make a prediction as to whether or not the fuse will shortly trip. This firstly gives the possibility of still being able to perform a corrective intervention, possibly before the fuse trips. Secondly, this information is also extremely helpful for planning preventive maintenance.

In a further advantageous embodiment and development of the fuse, the measured value is transmitted wirelessly by the transmission apparatus to the reception device. For a wireless transmission of the measured value by the transmission apparatus to the reception device, transmission methods such as Bluetooth, RFID (both active and passive), Zigbee, etc. come into consideration, for example.

In a further advantageous embodiment and development of the fuse, the measurement device is designed to be self-powered. This should be understood to mean that the measurement device manages without an external power source. The power required to transmit the measured signal is then provided for example by a transformer, by passive RFID or using a dedicated battery. In this way, the retrofitting of existing installations is considerably simplified.

In a further advantageous embodiment and development of the fuse, one of the two connection elements is routed through the housing of the measurement device. In particular when using a transformer, a toroidal housing that is attached to one of the two connection elements of the fuse constitutes a space-saving solution for integrating the measurement device into the fuse.

The fuse body according to at least one embodiment of the invention for a fuse of the type described in at least one embodiment above has a first reception space designed to receive the fuse element and a second reception space, designed to receive the measurement device and spatially separated from the first reception space, wherein the second reception space forms a structural unit with the first reception space.

The first reception space of the fuse body is in this case pressure-stable, that is to say designed to receive the pressure occurring when the fuse trips, and thus constitutes the pressure body of the fuse, whereas the second reception space merely constitutes a protective function for the measurement device, on whose mechanical stability and strength considerably lower requirements are placed. The first and the second reception space in this case form a structural unit, that is to say the two bodies do not have to be installed for the first time when the fuse is exchanged or installed, but rather are already fixedly connected to one another, as a result of which installation expenditure is considerably simplified.

In one advantageous embodiment and development, an integral fuse body is formed by the first and the second reception space. In particular with regard to manufacturing the fuse body by way of an additive manufacturing method, also referred to colloquially as "3D printing", an integral configuration of the fuse body is advantageous, since subsequent installation steps are thereby avoided. The manufacturing costs of the fuse body are thereby able to be further reduced.

In a further advantageous embodiment and development, the integral fuse body is formed from a ceramic material or a thermostable plastic. Ceramic materials are particularly suitable for manufacturing a fuse body due to their high pressure resistance. Thermostable plastics, provided that they are sufficiently thermally stable, are distinguished by contrast by their simplified processability with at the same time comparatively low manufacturing costs.

In a further advantageous embodiment and development of the fuse body, the first reception space and the second reception space are fixedly but detachably connected to one another. This results in the advantage that, after the fuse has tripped, the second reception space in which the measurement device is received is possibly able to be reused. This is in particular beneficial when the material costs and manufacturing costs of the measurement device are comparatively high in comparison with the rest of the fuse.

In a further advantageous embodiment and development of the fuse body, the first reception space and the second reception space are formed from different materials. In this way, both reception spaces are able to be adapted to the different requirements respectively placed on them.

In a further advantageous embodiment and development of the fuse body, the reception spaces that are combined to form the structural unit are surrounded by an additional sleeve 16. Using the additional sleeve, which may also consist for example of paper or a plastic coating, the structural unit of the fuse body is accentuated.

The system according to at least one embodiment of the invention for monitoring the state of an electrical circuit has at least one fuse of an embodiment of the type described above. The system furthermore has a reception device that is arranged outside the fuse and is designed to receive a measured value transmitted by the transmission apparatus.

Using the system for monitoring the state of an electrical circuit, the at least one physical state measured value of the fuse is transmitted to the reception device—for example to a control station—by way of the transmission apparatus of the fuse. In this way, it is also possible to remotely monitor the state of the fuse.

The method according to at least one embodiment of the invention for monitoring an electrical circuit, which has at least one state monitoring system of the type described above having at least one fuse, includes the steps:

d) measuring a physical measured value of the fuse using the measurement device;

e) transmitting the physical measured value to a reception device, arranged outside the fuse, of the system, using the transmission apparatus; and f) further processing the transmitted measured value.

With regard to the advantages of the method according to at least one embodiment of the invention for monitoring an electrical circuit having at least one state monitoring system of the type described above, reference is made to the above explanations with regard to the advantages of the fuse according to at least one embodiment of the invention and of the fuse body according to at least one embodiment of the invention. With regard to the transmission, formulated in step b), of the physical measured value, it is pointed out that this is understood to mean both a transmission of the pure measured values, that is to say of the raw data, and a transmission of measured values that are pre-processed—for example aggregated or compressed—by way of the processing apparatus.

In the various figures of the drawing, identical parts are always provided with the same reference signs. The description applies to all of the drawing figures in which the corresponding part is likewise able to be seen.

Figure 1:
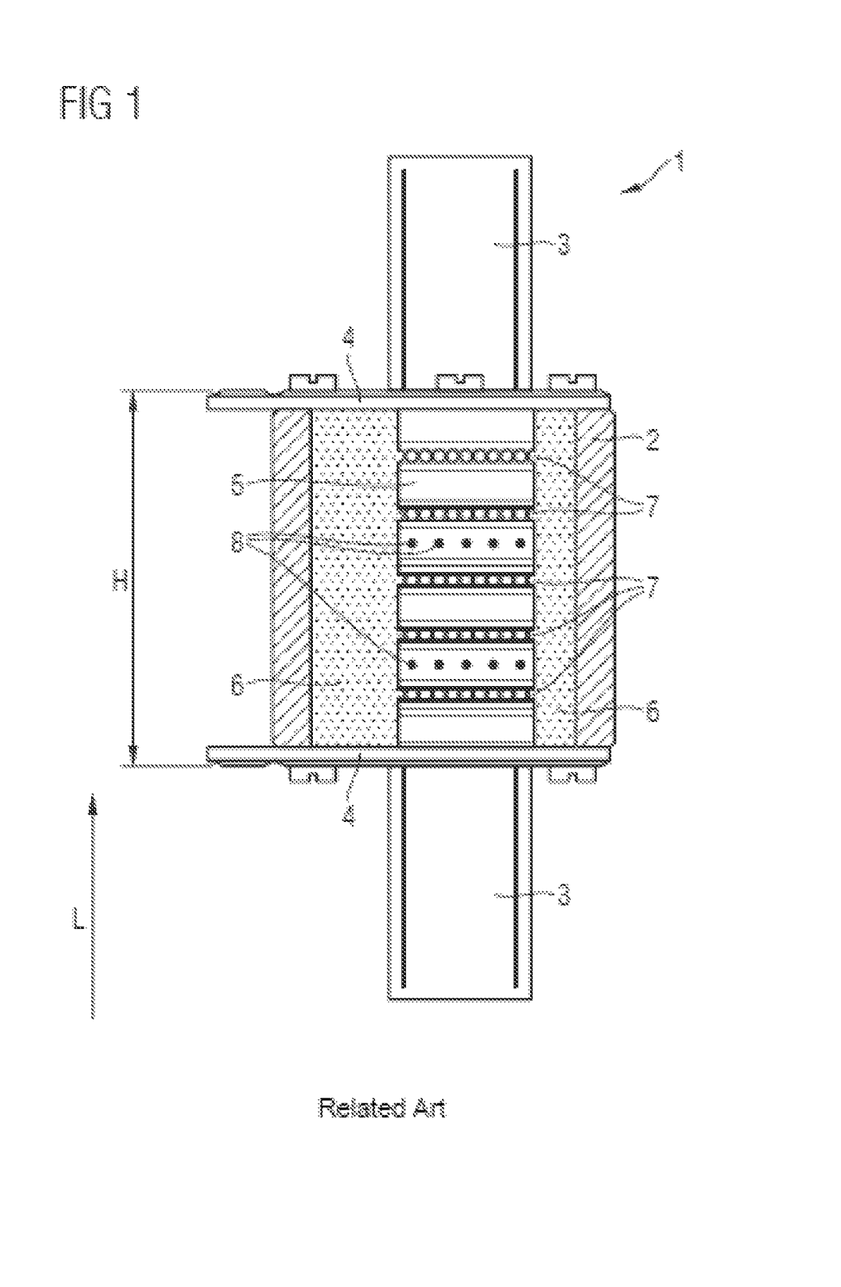
FIG. 1 is a schematic illustration of an NH fuse known from the prior art.

FIG. 1 schematically shows the basic structure of a standardized NH fuse, as is already previously known from the prior art. The fuse 1 has two connection elements 3, which consist of an electrically conductive material, for example copper. In the illustrations, the connection elements 3 are designed as blade contacts—this is however not essential to the invention. The connection elements 3 are fixedly and tightly mechanically connected to a protective housing 2 that includes a solid, nonconductive and as far as possible heat-resistant material, for example of a ceramic, and serves as pressure body for the fuse 1. The protective housing 2 generally has a tubular or hollow-cylindrical basic shape and is externally closed in a pressure-tight manner, for example using two closure caps 4. The connection elements 3 in this case each extend through an aperture formed in the closure caps 4 into the cavity of the protective housing 2. In this cavity there is arranged at least one what is known as fuse element 5 that electrically connects the two connection elements 3 to one another.

The rest of the cavity is for the most part completely filled with an extinguishing means 6 that serves to extinguish and cool the fuse 1 when it is tripped and completely surrounds the fuse element 5. Quartz sand is used as extinguishing means 6, for example. Instead of the one fuse element 5 illustrated in FIG. 1, it is likewise possible to arrange a plurality of fuse elements 5 electrically connected in parallel to one another in the protective housing 2, and correspondingly to make contact with the two contact elements 3. The trip characteristic curve—and therefore the trip behavior—of the fuse 1 is able to be influenced by the type, number, arrangement and layout of the fuse elements 5.

The fuse element 5 generally includes a material with good conductivity, such as copper or silver, and has a plurality of rows of narrow points 7 and one or more solder deposits 8—what are known as solder points—over its length, that is to say in its direction of longitudinal extent L. The trip characteristic curve of the fuse 1 is likewise able to be influenced and adapted to the respective case of application by the rows of narrow points 7 and the solder points 8. In the case of currents that are smaller than the nominal current of the fuse 1, only so much power loss is converted in the fuse element 5 that said power loss is quickly able to be output externally in the form of heat by way of the extinguishing sand 6, the protective housing 2 and the two connection elements 3. The temperature of the fuse element 5 in this case does not increase beyond its melting point. If a current that lies in the overload region of the fuse 1 flows, then the temperature inside the fuse 1 continuously increases until the melting point of the fuse element 5 is exceeded and this melts through one of the rows of narrow points 7. In the case of high fault currents—as occur for example due to a short circuit—so much power is converted in the fuse element 5 that this is heated practically over the entire length and consequently melts at all of the rows of narrow points 7 at the same time.

Since liquid copper or silver still has good electrically conductive properties, the flow of current is not yet interrupted at this time. The melt formed from the fuse element 5 is therefore heated further until it finally transitions into the gaseous state, as a result of which a plasma forms. A light arc in this case occurs so as to further maintain the current flow through the plasma. In the last stage of a fuse disconnection, the conductive gases react with the extinguishing means 6, which for the most part includes quartz sand in the case of conventional fuses 1. This is melted due to the extremely high temperatures, brought about due to the light arc, in the environment of the light arc, which leads to a physical reaction of the molten fuse element material with the surrounding quartz sand 6. Since the reaction product occurring in this case is not electrically conductive, the current flow between the two connection elements 3 quickly drops to zero. In this case, however, it should be borne in mind that a corresponding mass of fuse element material also requires a corresponding mass of extinguishing means. Only in this way is it able to be ensured that there is still enough extinguishing means 6 present at the end of the fuse disconnection to effectively bind all of the conductive plasma.

Figure 2:
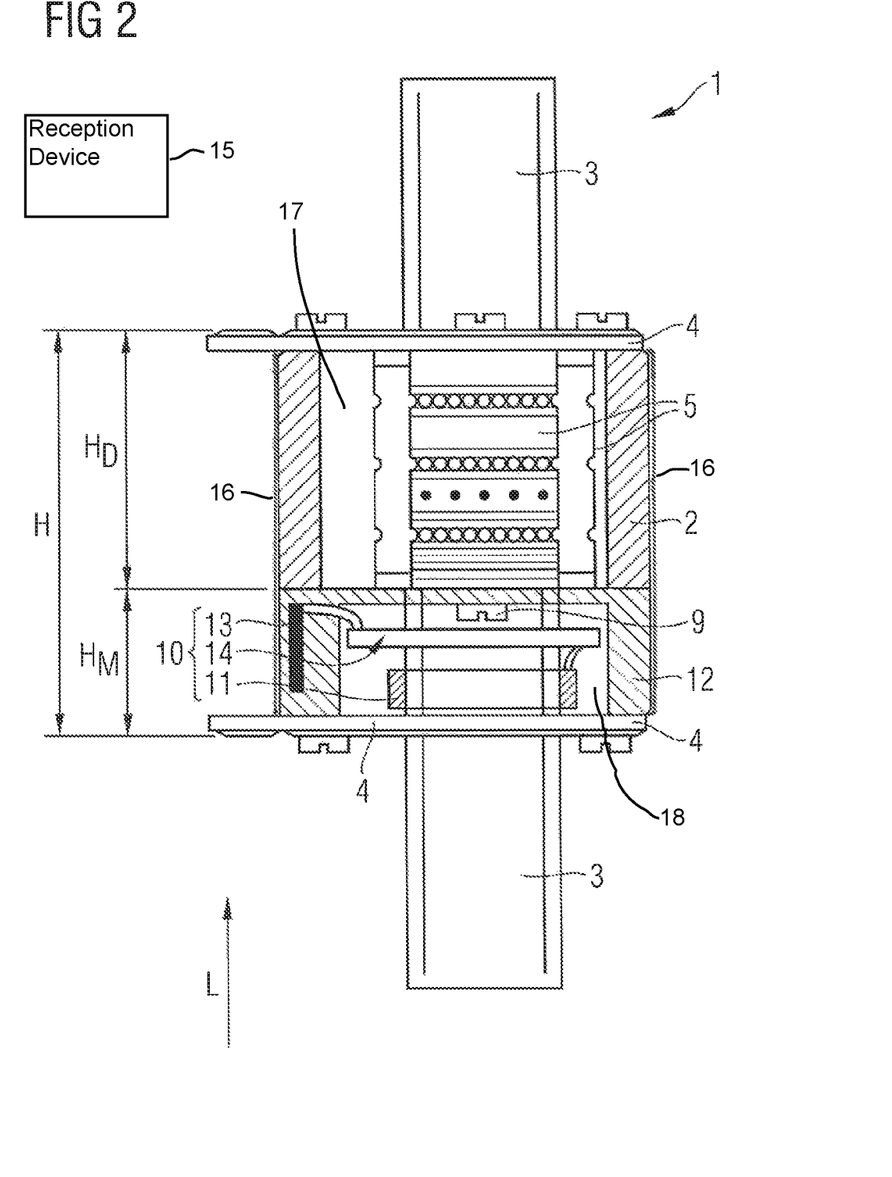
FIG. 2 is a schematic illustration of the fuse according to an embodiment of the invention.

FIG. 2 schematically illustrates the fuse 1 according to the invention. The fuse has a protective housing 2, defining a first reception space 17, and a further housing 12, defining a second reception space 18, that are arranged so as to lie behind one another in the direction of longitudinal extent L and overall reach the height H of a standardized NH fuse (as illustrated in FIG. 1). In the further housing 12 there is arranged a measurement device 10 that has a sensor element 11 for recording a physical state measured value of the fuse 1 and a transmission apparatus 13 for transmitting the measured value to a reception device (not illustrated) arranged outside the fuse 1. The sensor element 11 is in the present case designed as a transformer for measuring an electric current I flowing through the fuse 1; for this purpose, as an alternative or in addition, however, other sensor elements, for example a Hall sensor or a temperature sensor, also come into consideration.

By contrast, it is essential to the invention that the measurement device has a dedicated housing 12 in which the at least one sensor element is received and held and that is mechanically connected to the protective housing—by way of a screw 9 in the example embodiment illustrated in FIG. 2, other connecting means also coming into question for this purpose. In this case, the overall installation space required for the protective housing 2 and the further housing 12 is as great as the installation space of a standardized NH fuse. In other words: the combined installation space taken up by the protective housing 2 and further housing 12 corresponds to the predefined installation space of a standardized NH fuse, wherein the measurement device is now simply arranged in an integrated manner in this installation space in addition to the actual fuse. In this way, the fuse 1 according to the invention is also able to be used for retrofit applications in the context of retrofitting or modernization of existing electrotechnical installations in the context of which a conventional fuse without a measurement device is intended to be replaced with the fuse according to the invention.

The fuse 1 according to the invention therefore has the same height H as the standardized NH fuse illustrated in FIG. 1 in its direction of longitudinal extent L. However, the height H in the case of the fuse 1 according to the invention is divided into a first section having a first height HD and a second section having a second height HM. The first height HD in this case denotes the height of the pressure body 2, that is to say of the actual protective body 2 of the fuse 1, and the second height HM relates to the height of the second housing 12 in which the measurement device 10 is arranged. Considerably lower requirements are also placed on this housing in terms of its mechanical stability.

The sensor element 11 is electrically conductively connected to the processing apparatus 14, which is schematically illustrated, in the example embodiment illustrated in FIG. 2, as a circuit board that is populated with suitable components for processing the measured signal. The transmission apparatus 13 is likewise electrically conductively connected to the processing apparatus 14 depicted as a circuit board. The transmission apparatus 13 may be for example an RFID module, wherein both active RFID and passive RFID solutions come into question. Other—advantageously wireless—transmission techniques, such as Bluetooth or Zigbee, also come into consideration for this purpose. In the example embodiment illustrated in FIG. 2, the transmission apparatus 13 is integrated into the wall of the further housing 12. This has the advantage that the transmission power is able to be considerably lower than in the case of a transmission apparatus 13 arranged inside the housing 12, an arrangement inside the housing likewise being possible.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE SIGNS

1 fuse
2 protective housing/pressure body
3 connection element
4 closure cap
5 fuse element
6 extinguishing means
7 row of narrow points
8 solder deposit
9 screw
10 measurement device
11 sensor element
12 housing
13 transmission apparatus
14 processing apparatus
H height
L direction of longitudinal extent

What is claimed is:

1. A fuse including an integrated measurement function, comprising:
   a protective housing, defining a first reception space, two electrical connection elements of the fuse being routed out of the protective housing and at least one fuse element being arranged in the protective housing, the at least one fuse element electrically conductively connecting the two electrical connection elements in the first reception space of the protective housing to one another;
   a dedicated housing, defining a second reception space, mechanically connected to the protective housing forming a single structural unit; and
   a measurement device including at least one sensor element to record a physical state measured value of the fuse and a transmission apparatus to transmit the measured value to a reception device arranged outside the fuse, the measurement device being disposed in the second reception space of the dedicated housing in which the sensor element is received and held, wherein an overall installation space required for the protective housing and the dedicated housing corresponding to an installation space of a standardized NH fuse.

2. The fuse of claim 1, wherein the at least one sensor element includes a further sensor element configured to record a further physical state measured value of the fuse.

3. The fuse of claim 1, wherein the transmission apparatus is arranged in the dedicated housing.

4. The fuse of claim 1, wherein the measurement device includes a processing apparatus to process the measured value, the processing apparatus being arranged in the dedicated housing and being coupled to the at least one sensor element and to the transmission apparatus.

5. The fuse of claim 4, wherein the processing apparatus includes a microprocessor or a microcontroller.

6. The fuse of claim 1, wherein the at least one sensor element is designed to record a current measured value of the fuse and includes a transformer or a Hall-effect sensor.

7. The fuse of claim 1, wherein the at least one sensor element is designed to record a temperature measured value of the fuse.

8. The fuse of claim 1, wherein the measured value is transmitted wirelessly by the transmission apparatus.

9. The fuse of claim 4, wherein the measurement device is designed to be self-powered.

10. The fuse of claim 1, wherein one of the two electrical connection elements is routed through the dedicated housing.

11. A fuse body for the fuse of claim 1, comprising:
a first reception space, designed to receive the fuse element,
a second reception space, designed to receive the measurement device and spatially separated from the first reception space, the second reception space forming a structural unit with the first reception space.

12. The fuse body of claim 11, wherein the first reception space and the second reception space form an integral fuse body.

13. The fuse body of claim 12, wherein the integral fuse body is formed from a ceramic material.

14. The fuse body of claim 11, wherein the first reception space and the second reception space are fixedly but detachably connected to one another.

15. The fuse body of claim 14, wherein the first reception space and the second reception space are formed from different materials.

16. The fuse body of claim 11, wherein the first reception space and the second reception space combined to form the structural unit, are surrounded by an additional sleeve.

17. A system for monitoring a state of an electrical circuit, comprising:
at least one of the fuse of claim 1; and
a reception device, arranged outside the at least one fuse and designed to receive a measured value transmitted by the transmission apparatus.

18. The fuse of claim 2, wherein the transmission apparatus is arranged in the dedicated housing.

19. The fuse of claim 2, wherein the measurement device includes a processing apparatus to process the measured value, the processing apparatus being arranged in the dedicated housing and being coupled to the at least one sensor element and to the transmission apparatus.

20. The fuse of claim 19, wherein the processing apparatus includes a microprocessor or a microcontroller.

21. The fuse of claim 1, wherein the protective housing is configured to receive a pressure occurring when the fuse is heated or tripped, and the dedicated housing is configured to receive and to fasten the sensor element and to protect the sensor element against external disruptions, the dedicated housing having lower mechanical stability than the protective housing.

22. A method for monitoring an electrical circuit including at least one state monitoring system having at least one fuse, the method comprising:
measuring a physical measured value of a fuse element housed in a first reception space defined by a protective housing of the at least one fuse using a measurement device housed in a second reception space defined by a dedicated housing of the at least one fuse;
transmitting the physical measured value to a reception device, arranged outside of the at least one fuse, using a transmission apparatus housed in the second reception space; and
further processing the transmitted measured value.

23. The method of claim 22, wherein the at least fuse includes
two electrical connection elements of the fuse being routed out of the protective housing and at least one fuse element being arranged in the protective housing, the at least one fuse element electrically conductively connecting the two electrical connection elements in the protective housing to one another; and
the measurement device including at least one sensor element to record a physical state measured value of the fuse and the transmission apparatus to transmit the measured value to a reception device arranged outside the fuse, the measurement device further including a dedicated housing in which the at least one sensor element is received and held, the dedicated housing being mechanically connected to the protective housing, an overall installation space required for the protective housing and the dedicated housing corresponding to an installation space of a standardized NH fuse.

* * * * *